(12) United States Patent
Ruzic

(10) Patent No.: US 6,841,044 B1
(45) Date of Patent: Jan. 11, 2005

(54) CHEMICALLY-ENHANCED PHYSICAL VAPOR DEPOSITION

(75) Inventor: David Ruzic, Sadorus, IL (US)

(73) Assignee: Novellus Systems, Inc., San Jose, CA (US)

( * ) Notice: Subject to any disclaimer, the term of this patent is extended or adjusted under 35 U.S.C. 154(b) by 163 days.

(21) Appl. No.: 10/289,237

(22) Filed: Nov. 4, 2002

Related U.S. Application Data

(60) Provisional application No. 60/407,187, filed on Aug. 28, 2002.

(51) Int. Cl.$^7$ .............................................. C23C 14/32
(52) U.S. Cl. ............................. 204/192.1; 204/192.12; 427/576
(58) Field of Search ..................... 204/192.1, 192.12; 427/576

(56) References Cited

U.S. PATENT DOCUMENTS

| | | | | | |
|---|---|---|---|---|---|
| 4,492,620 | A | * | 1/1985 | Matsuo et al. | 204/192.12 |
| 5,194,398 | A | * | 3/1993 | Miyachi et al. | 438/482 |
| 6,093,966 | A | * | 7/2000 | Venkatraman et al. | 257/751 |
| 6,235,163 | B1 | * | 5/2001 | Angelo et al. | 204/192.12 |

OTHER PUBLICATIONS

Chen, Xiaomeng, Frisch, Harry L.; Kaloyeros, Alain E.; Arkles, Barry and Sullivan, John, "Low Temperature Plasma–Assisted Chemical Vapor Deposition of Tantalum Nitride from Tantalum Pentabromide for Copper Metallization," Jan./Feb. 1999, *J. Vac. Sci. Technol.*, B 17(1), pp. 182–185.

Cheng, Peter F.; Rossnagel, S.M., and Ruzic, David N., "Directional Deposition of Cu into Semiconductor Trench Structures Using Ionized Magnetron Sputtering," Mar./Apr. 1995, *J. Vac. Sci. Technol.*, B 13(2), pp. 203–208.

Cho, Kwang–Nam; Han, Chang–Hee; Noh, Kyung–Bong; Oh, Jae–Eung; Paek, Su–Hyoun; Park, Chang–Soo; Lee, Sang–In; Lee, Moon Yong and Lee, Jong Gil, "Remote Plasma–Assisted Metal Organic Chemical Vapor Deposition of Tantalum Nitride Thin Films with Different Radicals," Dec. 1998, *Jpn. J. Appl. Phys.*, vol. 37 (1998), pp. 6502–6505.

Endle, J.P.; Sun, Y–M.; White, J.M. and Ekerdt, J.G., "X–Ray Photoelectron Spectroscopy Study on TiN Films Produced with Tetrakis (dimethylamido) Titanium and Selected N–Containing Precursors on $SiO_2$," May/Jun. 1998, *J. Vac. Sci. Technol.*, A 16(3), pp. 1262–1267.

Green, K.M.; Hayden, D.B.; Juliano, D.R. and Ruzic, D.N., "Determination of Flux Ionization Fraction Using a Quartz Crystal Microbalance and a Gridded Energy Analyzer in an Ionized Magnetron Sputtering System," Dec. 1997, *Rev. Sci. Instrum.*, 68 (12), pp. 4555–4560.

Han, Chang–Hee; Cho, Kwang–Nam; Oh, Jae–Eung; Paek, Su–Hyoun; Park, Chang–Soo; Lee, Sang–In; Lee, Moon Yong and Lee, Jong Gil, "Barrier Metal Properties of Amorphous Tantalum Nitride Thin Films Between Platnium and Silicon Deposited Using Remote Plasma Metal Organic Chemical Vapor Method," May 1998, *Jpn. J. Appl. Phys.*, vol. 37 (1998), Pt. 1, No. 5A, pp. 2646–2651.

Hayden, D.B.; Juliano, D.R.; Green, K.M., Ruzic, D.N.; Weiss, C.A.; Ashitani, K.A. and Licata, T.J., "Characterization of Magnetron–Sputtered Partially Ionized Aluminum Deposition," Mar./Apr. 1998, *J. Vac. Sci. Technol.*, A 16(2), pp. 624–627.

Hayden, D.B.; Juliano, D.R.; Neumann, M.N.; Allain, M.C. and Ruzic, D.N., "Helion Plasma Source for Ionized Physical Vapor Deposition," 1999, *Surface and Coatings Technology*, 120–121 (1999), pp. 401–404.

Klawuhn, E.; D'Couto, G.C.; Ashtiani, K.A.; Rymer, P.; Biberger, M.A. and Levy, K.B., "Ionized Physical–Vapor Deposition Using a Hollow–Cathode Magnetron Source for Advanced Metallization," Jul./Aug. 2000, *J. Vac. Sci. Technol.*, A 18(4), pp. 1546–1549.

Lee, Hoojeong; Sinclair, Robert; Li, Pamela and Roberts, Bruce, "The Failure Mechanism of MOCVD TiN Diffusion Barrier at High Temperature," 1996, *Mat. Res. Soc. Symp. Proc.*, vol. 324, pp. 279–284.

Lucovsky, Gerald; Tsu, David V. and Markunas, Robert J., "Formation of Thin Fims by Remote Plasma Enhanced Chemical Vapor Deposition (Remote PECVD)," Feb. 1990, in *Handbook of Plasma Processing Technology*, eds. Rossnagel, Cuomo and Westwood, Noyes Publications, pp. 387–408.

Musher, Joshua N. and Gordon, Roy G., "Atmospheric Pressure Chemcial Vapor Deposition of Titanium Nitride from Tetrakis (diethylamido) Titanium and Ammonia," Feb. 1996, *J. Electrochem. Soc.*, vol. 143, No. 2, pp. 736–744.

(List continued on next page.)

*Primary Examiner*—Bret Chen
(74) *Attorney, Agent, or Firm*—Beyer Weaver & Thomas, LLP

(57) ABSTRACT

A process merges chemical vapor deposition and physical vapor deposition technologies. It allows physical and chemical vapor deposition to occur in the same process chamber, contemporaneously. The "physical" component involves creation of ionized metal atoms. Ionization is typically accomplished via a plasma within the chamber. If the metal vapor is generated by sputtering, a separate plasma generation mechanism may be employed, which is different from the mechanism employed to generate a "source plasma" for generating sputtering species (e.g., argon ions). Alternatively, a single plasma source may be employed to generate the sputtering species and provide additional ionization of the metal vapor, as is the case with hollow cathode magnetron chambers. In some cases, the CVD precursor is introduced through a first line into the process chamber, while a sputtering gas is introduced via a second line.

21 Claims, 1 Drawing Sheet

OTHER PUBLICATIONS

Peng, Y.C.; Chen, L.J.; Hsieh, W.Y.; Yang, Y.R. and Hsieh, Y.F., "Structural and Electrical Properties of Chemical Vapor Deposition Tungsten Overgrowth on Physical Vapor Deposited and Metalorganic Chemical Vapor Deposited TiN Adhesion Layers," Jul./Aug. 1998, *J. Vac. Sci. Technol.,* B 16(4), pp. 2013–2018.

Reif, Rafael, Plasma Enhanced Chemical Vapor Deposition of Thin Films for Microelectronics, Feb. 1990, in *Handbook of Plasma Processing Technology,* eds: Rossnagel, Cuomo and Westwood, Noyes Publications, pp. 260–284.

Truong, C.M.; Chen, P.J.; Corneille, J.S.; Oh, W.S. and Goodman, D.W., "Low–Pressure Deposition of TiN Thin Films from a Tetrakis (diethylamido) Titanium Precursor," 1995, *J. Phys. Chem.,* 1995, 99, pp. 8831–8842.

Tsai, M.H.; Sun, S.C.; Tsai, C.E.; Chuang, S.H. and Chiu, H.T., "Comparison of the Diffusion Barrier Properties of Chemical–Vapor–Deposited TaN and Sputtered TaN Between Cu and Si," May 1996, *J. Appl. Phys.,* 79 (9), pp. 6932–6938.

* cited by examiner

CHEMICALLY-ENHANCED PHYSICAL VAPOR DEPOSITION

CROSS-REFERENCE TO RELATED APPLICATIONS

This application claims priority under 35 U.S.C. 119(e) from U.S. Provisional Patent Application No. 60/407,187, filed Aug. 28; 2002, naming D. Ruzic as inventor, and titled "CHEMICALLY-ENHANCED PHYSICAL VAPOR DEPOSITION (CEPVD)." That provisional application is incorporated herein by reference for all purposes.

BACKGROUND

Liner deposition is a necessary unit operation in integrated circuit fabrication. "Liners" include diffusion barrier layers, seed layers, capping layers, and the like. They are made from metal-containing compounds or metals themselves, such as copper, tungsten, tantalum, titanium, and nitrides of these. As device features shrink well below the 0.5 micrometer scale, there is little room for imperfection in the deposited liners. The challenge is particularly great in damascene processes and other processes where the liner must conformally cover high aspect ratio sub-0.5 micrometer scale trenches, vias, or other recesses. Not only must the liner conformally cover the recess, but it must also adhere well to the underlying dielectric or other support material, be relatively free of impurities and, for many applications, have a stable crystallographic morphology. In cases where the liner carries part of the electrical current flowing in the interconnect, low electrical resistance is also desired.

Current film deposition processes have difficulty meeting all these requirements. Physical vapor deposition techniques can produce high quality, high purity, low resistance liners. But PVD liners are insufficiently conformal for processes employing very narrow trenches having high aspect ratios. Chemical vapor deposition and atomic layer deposition can produce superbly conformal layers, but those layers are often hampered by impurities and poor morphology—frequently resulting from organic decomposition products of chemical vapor deposition precursors. The relatively high resistivity of chemical vapor deposition films is a significant downside. Further, the relatively high process temperatures employed with CVD can limit its application.

What is needed therefore is an improved liner deposition process to meet the needs of modern integrated circuit fabrication.

SUMMARY

This invention merges chemical vapor deposition and physical vapor deposition technologies. This is not a trivial accomplishment. Conventional CVD and PVD processes require much different pressures and process chamber configurations. The present invention allows physical and chemical vapor deposition to occur in the same process chamber, contemporaneously. The "physical" component of the invention involves metal deposition from a source metal. A significant fraction of the deposited metal atoms are ionized at the time they reach the substrate. In one example, a "primary" plasma generates sputtering species and a "secondary" plasma ionizes metal atoms created by sputtering. In some embodiments, the primary and secondary plasmas are generated by separate mechanisms. In other embodiments, a single plasma source both generates the sputtering species and provides the additional ionization of the metal atoms. A hollow cathode magnetron (HCM) process chamber can be used for this purpose. Regardless of how the ionized metal atoms are produced, the system will include some mechanism for introducing one or more CVD precursors. In some cases, these are introduced through one line, while the sputtering gas (if used) is introduced via a different line. In other cases, all species are introduced through a single line.

One aspect of the invention provides methods of depositing a layer of metal or metal containing compound on a substrate. Such methods may be characterized by the following operations (which may be performed concurrently or sequentially or overlap): (a) physically producing ionized metal atoms and allowing the metal atoms to deposit on the substrate in a process chamber; and (b) adding a precursor containing one or more elements desired in the deposited layer to the process chamber to react chemically or otherwise deposit and produce the metal or metal containing compound. Both operations contribute to the total metal in the deposited layer, and preferably each contributes at least about 5% of the total.

Typically, the metal vapor is produced from a metal target, as by sputtering or evaporation. At the substrate surface, the ionized metal atoms preferably comprise at least about 5 percent of the total metal atoms derived from such target. Ionization is typically accomplished by exposing metal atoms from the target to a plasma. The plasma can be generated by any suitable mechanism such as a hollow cathode magnetron target or RF coils. In a typical embodiment, the plasma is maintained by applying a power of between about 100 and 1000 Watts to an electrode or coil. Upon contact with the plasma, the substrate will attract ionized metal atoms to it. This attraction can be augmented by imparting a negative bias to the substrate.

The layers produced by this invention are typically metals, metal alloys, or metal containing materials. The exact composition of the layers depends upon which chemical precursors, metal targets, carrier gases and/or sputtering gases are used. "Reactive" carrier/sputtering gases participate in reactions leading to the deposited layer. For example nitrogen can be used as a reactive carrier/sputtering gas to produce metal nitride layers. In many cases, the precursor is a volatile organometallic compound.

Examples of metals that can be produced by the present invention include copper, titanium, tantalum, cobalt, tungsten, ruthenium, and alloys of these. One specific application involves depositing a copper seed layer for subsequent copper electrochemical or electroless deposition. Another specific application involves depositing a metal nitride diffusion barrier.

It is possible to generate structures in which the composition varies over the layer thickness. Such structures can be produced by varying the relative rates of PVD and CVD. For example, initially, most of the layer may be formed by sputtering a metal. Later, the sputter rate may be decreased and/or the CVD rate increased to deposit primarily metal nitride (assuming that the CVD employs precursors that produce a nitride). Compositionally varying layers may also be produced by temporally changing the composition of a carrier gas, a sputtering gas, or the precursor.

Another aspect of the invention pertains to process chambers for performing chemically enhanced physical vapor deposition. Such chambers may be characterized by the following features: (a) a substrate support; (b) a primary plasma generation mechanism for creating a sputtering plasma proximate to a target; (c) a secondary plasma generation mechanism for creating a plasma to ionize a metal vapor; and (d) an inlet for introducing a chemical vapor deposition precursor proximate to the substrate support. Optionally, there may be a separate inlet for introducing a sputtering gas. If only a single inlet is used, the CVD precursor and its carrier gas serve a second role: that of a sputtering gas.

The primary and secondary plasma generation mechanisms are functionally distinct (one is for creating a sputtering source and the other is for ionizing metal atoms) but may together comprise a single mechanism such as a hollow cathode magnetron.

The process chamber will require some source of metal. Frequently, this is a sputter target, comprising one or more of copper, a copper alloy, titanium, cobalt, tungsten, tantalum, ruthenium, and nitrides of these. The process chamber may include various additional features. One example is a temperature controller for controlling the bulk temperature of the substrate. Another example is a vacuum source for maintaining an internal pressure in the process chamber of between about 1 and 500 mTorr. Another example is a bias source coupled to the substrate support for applying a bias to the substrate during deposition.

These and other features and advantages of the invention will be described in more detail below with reference to the associated drawing.

DETAILED DESCRIPTION OF PREFERRED EMBODIMENTS

Overview

Figure 1:
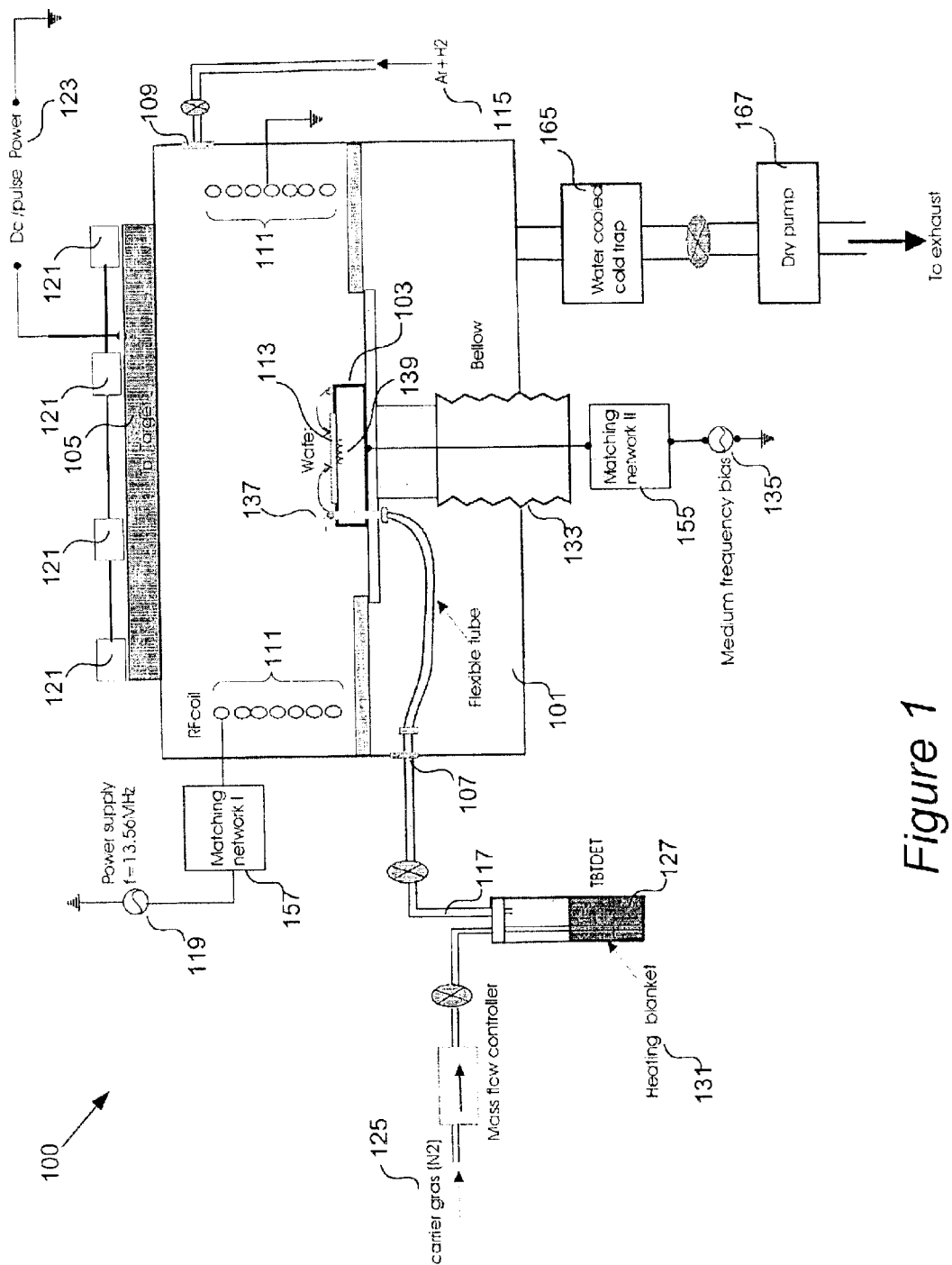
FIG. 1 depicts an apparatus in accordance with one embodiment of the present invention.

As indicated, this invention provides a new deposition process that merges elements of physical vapor deposition and chemical vapor deposition. The process is conducted at a pressure compatible with both CVD and ionized PVD (e.g., between about 1 and 500 mTorr). It employs CVD in any of its various forms, essentially unchanged from conventional processes, but generally at slightly lower pressures. In addition, it employs a physical deposition process that directs metal ions onto the substrate, thereby providing at least some of the energy needed to drive the CVD reaction. As a consequence of this energy delivery, the substrate heating requirements are reduced or eliminated. Thus, an external heating element need provide only minimal heat (if any) to the substrate. In addition to delivering energy, the PVD process provides extra material, beyond that provided via the CVD process, to grow the deposition layer.

The methods of this invention should be distinguished from plasma enhanced chemical vapor deposition (PECVD) techniques, which also employ plasmas, but do so to facilitate the chemical deposition reaction. Unlike PECVD, the present invention employs a separate deposition source comprising a metal or metal containing compound. That source is vaporized and ionized, and typically, though not necessarily, it is a target (condensed state metal or compound) used for sputtering or evaporation.

Conventionally, metal films produced by CVD have higher resistivity and poorer texture than PVD films. They also require a relatively high deposition temperature (approximately 400–700 degrees C.), thereby consuming a fraction of the thermal budget allotted to the IC fabrication process. However, CVD has the ability to produce good sidewall coverage in very high aspect ratio features with sub-0.5 micron dimensions. Even the very best PVD processes will be unable to provide this level of coverage. Yet PVD films have the desired low resistivity and texture that provides greater reliability and performance.

In practice, the invention employs deposition from a chemical precursor to give the good conformal step coverage of CVD together with deposition directly from a metal source to provide the low resistivity and preferred morphology of PVD. The ionized physical metal deposition delivers kinetic energy to the deposition surface, through bombardment, promoting the film's adhesion and generating films of stable crystallographic orientation. The ion bombardment also volatilizes and/or desorbs impurities resulting from CVD precursor decomposition and reduces the substrate temperature needed for such decomposition. And unlike PECVD, few if any undesired byproducts of the plasma are incorporated into the growing film. Rather, the use of an ionized PVD system means that the ions present (e.g., $Ta^+$ $N^+$, and $N_2^+$ in the case of TaN) are exactly the ones required in the growing film.

As indicated, the ionized metal atoms are generated from a source such as a metal target. In the case of a Ta or TaN liner, the system includes a Ta target and a suitable sputter gas ambient—e.g., Ar in the case of Ta, and $Ar/N_2$ in the case of TaN. For the deposition of other metals (Cu, Cu alloys, Ti, TiN, Co, W, Ru, etc), the sputter target material and sputter gas ambient are chosen accordingly.

At least one chemical precursor gas is introduced concurrently with the generation of ionized metal atoms. The precursor gas or gases may contain the same or different metal or metals as the target used in the ionized physical vapor deposition portion of the invention. For example, one can use a tantalum sputtering target in conjunction with a titanium CVD precursor to deposit a liner containing both tantalum and titanium. Of course, any number of combinations of metals can be used in a similar fashion.

Optionally, a secondary ionization source, an additional CVD precursor gas, and/or a carrier gas are present. Further options for tailoring the process will be set forth below.

Apparatus

The present invention can be practiced in any process chamber that provides both ionized metal atoms and CVD precursors. Generally, such apparatus will have a pedestal or other support for the substrate. In addition, it will have an inlet for CVD precursors and a mechanism for generating dispersed ionized metal atoms. Typically, the ionized metal atoms are generated by a combination of a metal atom source and a mechanism to convert some of the metal atoms to ions. The metal source can be, for example, a metal target for sputtering or a metal source for evaporation.

The process chamber may have a second inlet for providing a sputtering gas assuming that sputtering is used to generate the dispersed metal atoms. In such cases, the process chamber may include a "primary" plasma generator to produce sputtering species such as argon ions. Regardless of whether such "primary" plasma generator is present, the chamber should have the capability of ensuring that a substantial fraction of the metal atoms reaching the substrate are ionized. In some embodiments, this is accomplished with a separate mechanism for generating a "secondary" plasma to ionize the metal atoms. In other embodiments, a single mechanism is employed to generate a plasma that serves as both the primary plasma to generate sputtering ions and the secondary plasma.

Regardless of whether the system requires one, two or even more plasma generation sources, those sources can be any one of the many available plasma generation mechanisms. As is known to those of skill in the art, suitable plasmas can be generated by mechanisms including magnetrons, capacitive coupling mechanisms, inductive coupling mechanisms, etc. One preferred example for use with this invention is a magnetron, such as a hollow cathode magnetron. Another preferred example is a magnetron coupled with a helical resonator coil.

Other features of a typical process chamber include a temperature controller for controlling the temperature of the bulk substrate and an electrode for negatively biasing the substrate so enhance attraction of metal ions to the substrate. As indicated, the metal ions help drive the CVD reaction. The mere presence of a plasma in contact with the substrate will impart some negative potential to the substrate. This directs metal ions onto the substrate. To increase the momentum of the ions striking the substrate, the substrate may be negatively biased. The chamber may also include a vacuum source capable of maintaining a pressure within the process chamber of between about 1 and 500 mTorr, for example.

In a specific embodiment, the methods of this invention may be carried out in a Galaxy™ PVD system (MRC, Orangeburg, N.Y.) fitted with any of various alternative ionization sources or in other vacuum-integrated PVD systems such as the INOVA™ or INOVA-xT™ from Novellus Systems, San Jose, Calif. or the Endura from Applied Materials, Santa Clara, Calif. Other systems, of course, can have the features required to perform the methods of this invention, as outlined herein.

FIG. 1 depicts one specific apparatus 100 suitable for practicing the present invention. A process chamber 101 contains a wafer pedestal 103 to which a wafer 113 is secured and held at a certain distance from a metal sputter target 105 (in this case a tantalum target). In some embodiments, the distance between the wafer 113 and the metal sputter target 105 is adjustable to optimize different parameters such as deposition rate and plasma conditions. In this figure, the distance is adjustable using a bellows 133. Shorter separation distances result in greater deposition rates, but make ionization of metal atoms more difficult. Larger separation distances have just the opposite effect: slower deposition but easier metal ion generation. Metal atoms require a certain residence time in a plasma to reach a significant level of ionization. Small separation distances may not allow this. In one specific example, the separation distance is approximately 150 millimeters, while the process chamber width is approximately 310 millimeters.

The pedestal 103 is attached to a power supply 135 (in this case medium frequency bias such as 200 kHz) so that the wafer 113 can be held at a desired potential. Note that one can use a DC bias —and this is often preferred when depositing onto a conducting film. RF biases are preferred for depositing onto insulating films. A matching network 155 is interposed between power supply 135 and pedestal 103 to form a matched load. The potential applied to wafer 113 depends on various other process conditions within the process chamber. The wafer can be heated by heating coils 139 situated on the backside of the wafer. A temperature controller may be used to control the heating.

A sputter carrier gas 115 (e.g., argon or argon and hydrogen) is introduced into the process chamber 101 via a gas inlet 109. Note that hydrogen can help scavenge organic decomposition products of chemical vapor deposition by reducing these products to lower alkanes such as methane. The sputter carrier gas 115 becomes ionized when subjected to a magnetic field created by magnets 121 (situated behind the metal sputter target 105) and an orthogonal electric field provided by a separate DC source 123 (connected to target 105). Together magnets 121 and DC source 123 serve as a magnetron, which provides a "primary plasma" for generating sputtering ions from carrier gas 115. In some embodiments, the DC potential on target 105 is pulsed to intensify the kinetic energy of the ions within plasma. Magnets 121 may be permanent magnets or electromagnets. The sputtering gas ions generated by the magnetron impinge upon the metal sputter target 105 to sputter metal atoms and form a metal vapor. The resultant sputtered metal atoms then deposit onto the surface of the wafer 113.

Process chamber 101 also includes RF coils 111 to generate an RF field within the process chamber 101 and thereby drive creation of additional plasma. As shown, RF coils 111 are attached to a power supply 119 via a matching network 157 employed to form a matched load reducing signal reflections. The additional (or "secondary") plasma generated by coils 111 serves to ionize some of the metal vapor atoms. It is positioned some distance away from the metal target. Note that while separate mechanisms may be employed to generate plasma within process chamber 101, separate isolated plasmas are not technically created. Rather, the regions of relatively high charged species concentration extend further throughout the process chamber interior. Outside this region, the plasma may diminish in concentration, but still be present.

In addition to the sputter carrier gas 115, a metal precursor containing gas 117 is also introduced into the process chamber 101 via another gas inlet 107. In some embodiments, the metal precursor containing gas 117 is formed by passing a carrier gas 125 (in this case nitrogen) over the liquid form of the metal precursor 127 (in this case the tantalum precursor TBTDET) to vaporize metal precursor molecules. The liquid form of the metal precursor 127 can be heated using a heating blanket 131 to aid the vaporization process. The gas inlet 107 is preferably situated so as to introduce the metal precursor containing gas 117 close to the surface of wafer 113. In this case, the metal precursor containing gas 117 is introduced to the surface of the wafer 113 using a gas ring configuration 137. When the metal precursor containing gas 117 contacts the surface of the wafer 113 and there reacts, a metal (e.g. tantalum) or metal containing material (e.g. tantalum nitride) is deposited onto the surface of the wafer 113. The separation distance between the gas inlet and the substrate can affect the deposition process. Preferably, the gas inlet is located very close to the substrate.

Note that in some embodiments, the sputtering gas may be the carrier gas provided from the gas ring 137. In such cases, the sputtering gas inlet 109 may be dispensed with, so that the only a gas inlet (or inlets) is provided from the CVD components of the process chamber.

Apparatus 100 may include flow control systems allowing the sputter carrier gas 115 and metal precursor containing gas to be introduced into the process chamber 103 simultaneously or at different times.

A pump 167 is employed to maintain the desired pressures within chamber 101 and to evacuate the chamber when necessary, as for example, between cycles of an ALD process. A water cooled trap 165 interposed between chamber 101 and pump 167 captures various species before they reach the pump.

The CEPVD apparatus of this invention can be used in a standalone reactor to deposit a film or it could be used as part of a vacuum-integrated process tool for a separate film deposition step. As one example, a tantalum layer is deposited in a first reactor by conventional PVD. Then, in a second reactor, a copper seed layer is deposited using the CEPVD process of this invention. In a different or related process flow, a first reactor in the vacuum-integrated process tool deposits a copper seed layer by PVD, and then a second reactor, a CEPVD reactor of this invention, is used to repair the previously deposited copper seed layer by conformally depositing additional copper.

Process Parameters

The parameters required to implement the CEPVD methods of this invention can vary over wide ranges, depending upon the desired application. This allows considerable flexibility in tailoring the film composition and morphology, as well as deposition rate. Among the parameters pertinent to the present invention are pressure within the process chamber (including partial pressures of the various gases supplied to the chamber), applied power to bias the substrate, applied power to various electrodes responsible for igniting and maintaining plasmas within the process chamber, plasma density, substrate temperature, flow rates of precursor(s), carrier gas, and sputtering gas, and compositions of the target, precursor gasses, carrier gases and sputtering gases. Many of these parameters also have an effect on the metal layer composition and morphology, including composition and morphology variations over the thickness of the deposited layer.

Fundamentally the methods and apparatus of this invention produce dispersed metal atoms. In many cases, they accomplish this with a target disposed in the chamber. The target comprises a metal or metal compound (e.g., a metal nitride) suitable for the particular application and it is sputtered or evaporated to produce the metal vapor. Other sources of metal vapor are possible and include arc sources such as filtered arc sources, for example. Sputtering may be accomplished with any of the various sputtering techniques such as DC sputtering and magnetron sputtering.

To ionize the metal atoms, the apparatus may generate a plasma in the region of the process chamber near where the metal vapor atoms are generated. As indicated, a system employing sputtering to generate the dispersed metal atoms will have a sputtering or "primary" plasma used to generate the sputtering species (frequently $Ar^+$, $N^+$, $N_2^+$, or a similar ion). This sputtering plasma is located quite close to the target and is well characterized in the art. In some process chambers, the mechanism for generating the sputtering plasma is insufficient to ionize a significant fraction of the metal atoms. So a secondary plasma generator mechanism (e.g., coils 111 shown in FIG. 1) is employed for this purpose. In other embodiments, the plasma generator responsible for providing sputtering species can also serve to create the ionized metal atoms. As explained, this is the case with a hollow cathode magnetron type plasma generator.

Regardless of the apparatus, the plasma should ionize a fraction of the metal atoms. Preferably at least about 5 percent of the metal atoms derived from the PVD source should be ionized upon contact with the substrate surface. More preferably, at least about 10 percent of these metal atoms will be ionized. Even more preferably, at least about 25 percent of them will be ionized. Ionized atoms are drawn to the substrate, so they deposit more rapidly than their neutral counterparts. Further, they contact the growing layer with significant momentum. This improves the film quality by favoring more stable and desired crystallographic morphologies. It can resputter deposited liner material at the bottoms and sidewalls of substrate features. It also provides energy to drive, at least partially, the CVD reaction and to clear some precursor decomposition products from the growing layer.

To provide the requisite quantities of ionized metal atoms at the substrate, the plasma should effectively ionize some fraction of the metal atoms coming off the metal target. The absolute ratio of metal ions to neutral metal atoms in the body of the chamber (away from the substrate surface) is not critical in most cases. The chamber geometry also plays an important role in ensuring that the metal ions reach the substrate surface. If the chamber is designed so that the metal atoms have a relatively long residence time in the plasma, then more of them will reach the substrate surface as ions.

The quantity of ionized metal atoms reaching the substrate surface can be measured by various techniques. Generally these techniques use a gridded energy analyzer atop a quartz crystal monitor so the flux of condensible ions can be distinguished from the background gas ions. Techniques for measuring quantities of metal ions contacting a substrate are described in the following article, which is incorporated herein by reference for all purposes: K. M. Green, D. B. Hayden, D. R. Juliano, and D. N. Ruzic, "Determination of Ionization Fraction and Plasma Potential Using a Quartz Crystal Microbalance and a Gridded Energy Analyzer in an Ionized Magnetron Sputtering System," Review of Scientific Instruments, 68, 4555–4560 (1997).

While not critical to the invention, the plasma preferably has a density of at least about $1 \times 10^9$ electrons per cubic centimeter, more preferably between about $1 \times 10^{10}$ and $1 \times 10^{12}$ electrons per cubic centimeter. These densities may be achieved by providing appropriate power levels to specific electrodes in the apparatus. Generally, the power to electrodes responsible for igniting and maintaining the secondary plasma will be between about 100 and 1000 Watts, although the power can reach 2 kilowatts in some embodiments. Other parameters affecting the fraction of metal atoms that are ionized upon contact with the substrate include the pressure in the chamber, the residence time of the metal atoms in the plasma, the relative sputtering rate, the bias on the wafer, and the temperature of the background gas (sputtering gas and/or CVD carrier gas). Some of the relevant parameters can be lumped into the "current and voltage characteristics" the magnetron (or other plasma generating mechanism) and the charge generation rate.

As indicated, conventionally the pressure for PVD or ionized PVD (e.g., 0.5100 mTorr) is significantly lower than that for CVD (e.g., about 200 mTorr to one atmosphere). In this invention, the total pressure within the process chamber should be sufficiently great to ignite a plasma but not too great that it cannot easily sustain the plasma. For many process chambers, this means that the total pressure will be between about 1 and 500 mTorr, more typically between about 1 and 300 mTorr, and most preferably between about 50 and 200 mTorr. Note that after a plasma is ignited, it may be possible to raise or lower the chamber pressure and still maintain the plasma. So, in some embodiments, it may be desirable to lower the total pressure after plasma ignition.

Understand that there is typically some pressure variation within the process chamber. Typically, at the inlet for the CVD carrier gas the pressure is relatively higher than at other locations within the chamber. A vacuum pump aggressively draws CVD gas and other components out of the chamber to maintain a low average pressure within the chamber. The local pressure variation is not important to this invention. The pressures listed herein are those measured at points away from the gas inlet. Typically, a pressure gauge provided on the side of the process chamber will measure the recited pressure.

Note that different species may contribute to the total pressure within the process chamber. In a typical example, the sputtering species may contribute between about 10 and 50 percent of the pressure, while the CVD precursor(s) and associated carrier gas contribute the remaining 50 to 90 percent. In one specific example, the sputtering gas has a partial pressure of between about 10 and 50 mTorr, while the CVD gasses have a partial pressure of between about 50 and 150 mTorr. In conjunction with certain other parameters (such as the sputtering plasma power), the relative partial pressures of the CVD and PVD components control the relative contributions of CVD and PVD to the overall deposition rate.

Other relevant parameters include power required to create the sputtering plasma and power required to bias the substrate. These power parameters or typically interrelated with the power required to generate the "secondary" plasma. In a typical embodiment, the power to the target (for sputtering) is between about 1 and 3 kilowatts, while the potential to bias the substrate is between about 0 and 100 volts and the power to the secondary plasma electrode is between about 0 and 2 kilowatts. In the case of a hollow cathode magnetron (where a single electrode is used for target sputtering and metal vapor ionization), the power applied to the electrode is between about 30 and 50 kilowatts (preferably about 35 kilowatts) for a 300 millimeter wafer.

The substrate must support the CVD reaction. Generally this means that energy is supplied to the substrate to increase the reaction rate. Conventionally, this is accomplished by heating the substrate with a heating element disposed in the pedestal supporting the wafer. In this invention, the momentum of ionized metal species striking the substrate surface imparts at least some of the energy required to drive the chemical deposition reaction. Hence, the amount of heat supplied to substrate by heater can be reduced, typically. The typical bulk substrate temperature will therefore be lower than in the case of conventional CVD. Many types of conventional temperature controller allow adjustment of the bulk wafer temperature as necessary to support CEPVD of this invention while minimizing depletion of the thermal budget for an IC fabrication process. For many materials deposited by CEPVD, the bulk temperature might range between about 100 and 400 degrees C.

Flow rates of precursor(s) and carrier gas will typically be close to that required for conventional CVD. The relative flow rates of multiple precursor gases will be determined by reaction kinetics, stoichiometry, etc., as with conventional CVD reactions. Of course, since some fraction of the deposited material originates from the metal vapor, the total CVD flow rate required to support a particular deposition rate can be reduced somewhat from that required in a conventional CVD reaction.

In CEPVD, both the PVD and CVD process components contribute significantly to the overall deposition. Preferably, each contributes at least about 5% by weight to the overall deposited layer. Thus, CVD contribution to the deposited layer preferably comprises between about 5 and 95% weight percent. The same is true for the PVD contribution. The relative contributions to the overall product composition is a manifestation of the relative deposition rates of the two processes. For CVD, precursor flow rate and energy supplied to the substrate surface dictate the deposition rate. For PVD, sputter rate, secondary plasma power, and substrate bias dictate the deposition rate. By controlling these parameters, one can control the relative contributions of PVD and CVD to the overall deposition product. Note that for the PVD component, a fraction of the deposited metal derives from neutral metal atoms that diffuse and settle onto the substrate. The ionized metal atoms are, in contrast, attracted to the substrate by a potential difference.

The compositions of targets, precursor gases, carrier gases, and sputtering gases are chosen to provide the desired composition of the metal layer or metal compound layer. Examples of metals and metal compounds that can be deposited by the CEPVD processes of this invention include tantalum, titanium, ruthenium, cobalt, copper, tungsten, nitrides and carbides of these, doped versions of these (e.g., boron or phosphorus doped versions, etc. In addition, combinations of metals and metal compounds can be deposited by using a combination of different PVD target and CVD precursors. Suitable CVD precursors include hexafluoroacetalacetonato Cu(I) trimethylvinylsilane (HFAC-TMVS) (also called CUPRASELECT™ from Shumacher Corporation) for copper, t-butyl-imino tris(diethylamido) tantalum (TBTDET) for tantulum and tantulum nitride, and tetrakisdiethylamino titanium (TDMAT) and tetrakisdimethylamino titanium (TDEAT) for titanium and titanium nitride. Typically, the target is a solid metal block or foil containing a metal to be incorporated in the deposited layer. Understand that when sputtering metal targets in a nitrogen environment, some nitride may form on the metal surface. In effect, one has a metal nitride target.

Note that both sputtering gases and carrier gases can be non-reactive or reactive. Non-reactive carrier gases, such as the noble gases, do not chemically react with precursors, metal sources, or deposited layers. Hence, they do not directly affect the composition of the deposited layers. Reactive carrier gases, such as nitrogen in some cases, can participate in deposition reactions and thereby impact the composition of the deposited layer. For example, nitrogen carrier gas or sputtering gas can supply atomic nitrogen to deposited nitride layers, such as tantalum nitride. Examples of potentially reactive carrier gases include nitrogen, oxygen, hydrogen, and ammonia.

One other parameter deserves mention. That is variation in deposition conditions over the course of an overall CEPVD procedure. For example, one can temporally separate introduction of distinct reactants including iPVD sputtered species and one or more CVD reactants or precursors. This allows for careful tailoring of the deposition profile, deposition speed, and composition of the deposited layer. In one approach, by changing the precursor composition and/or sputtering conditions and substrate bias midway through a CEPVD process, a manufacturer can deposit a bilayer or other structure having composition or morphology that varies with thickness. Possibly, a metal stack of different metals or different crystalline morphologies results. Or by substituting reactive carrier gas or sputtering gas for a non-reactive version, one can accomplish the same result. For example, by replacing argon with nitrogen midway through a deposition process, one can produce a bilayer, with metal on the bottom and metal nitride on top. The composition or morphology variations can occur abruptly or gradually, depending on the how abruptly or gradually the CEPVD process conditions vary.

In a related manner, one can perform an atomic layer deposition (ALD) type reactions using CEPVD. These generally involve depositing very thin and highly conformal layers, sequentially, one layer at a time. As known to those skilled in the art, ALD requires alternating contact cycles of two different reactants. A first reactant comes in contact with the substrate and adsorbs on the substrate surface to produce a saturated layer. Subsequently, a second reactant comes in contact with the saturated layer and converts it to a desired product; e.g., a cobalt layer. Because the quantity of first reactant available for reaction is only that quantity adsorbed on the substrate surface, the deposited layer is on the scale of single metal atoms or the basic stoichiometric unit of compounds. Repeating cycles of temporally separated first and second reactant exposure creates a gradually thickening deposited layer. In one preferred embodiment, the "CVD" component of CEPVD is performed in the manner of an ALD process, while the PVD component is performed as a background process used to improve the quality of the ALD deposited material.

Applications

A preferred application for the present invention is liner deposition on substrate surfaces having narrow and deep features. Thus, the processes of this invention find particular value in depositing liner over high aspect ratio (typically at least 3:1), narrow width (typically 1.5 microns or less and even sub 0.5 micron) gaps. The deposited liners are conformal high-quality metal or metal compound layers.

Integrated circuit fabrication processes present numerous applications. Many of these are associated with the "back-end" processes for forming the metal lines and interconnects that link circuit elements formed on an underlying semiconductor substrate. Among the integrated circuit features that can be formed by the invention are diffusion barrier layers, seed layers, capping layers to mitigate electromigration, antireflective layers for photolithography, and electrodes for DRAM capacitors.

Modern damascene processes require thin, conductive diffusion barriers made from tantalum nitride, titanium nitride, tungsten nitride, etc. These processes also require conductive seed layers for seeding subsequent electrodeposition reactions. Typically, though not necessarily, the seed layer is made from the material that is to be electrodeposited; e.g., copper. In some cases, the process will require a "nucleation" layer to support a subsequent electroless deposition reaction. Palladium is sometimes required as a nucleation or activation layer to support electroless deposition. The present invention can produce the required high quality diffusion barriers and seed layers. In the 90 nanometer technology node, for example, it is believed that these layers will be conventionally deposited to a thickness of approximately 10 nanometers.

Examples of deposition materials include, for example, tantalum, tantalum nitrides, copper, copper alloys, titanium, titanium nitride, cobalt, tungsten, tungsten nitride, and ruthenium. For any of these, the sputter target material and sputter gas ambient is chosen accordingly. An appropriate CVD precursor is also employed. Numerous precursors are well known to those skilled in the art.

In addition, certain non-conductive materials may be deposited by the present invention. These include, for example, silicon nitride and silicon carbide. In these cases, silicon is deposited from a PVD silicon sputter target, and the CVD precursor is silane, methane, etc. In other examples, one may deposit a low-k "SiOC" dielectric in which physical vapor deposition is conducted from a silicon dioxide target (using RF sputtering) in conjunction with a more conventional CVD oxide process.

This invention can deposit liners on many different types of substrate. Examples include insulators (conventional silicon oxide dielectrics, low-k dielectrics, polymeric films, etc.), metals (tantalum, titanium, ruthenium, cobalt, copper, tungsten, alloys of these, doped versions of these, etc) and semiconductors (silicon, germanium, gallium arsenide, etc).

EXAMPLE

Films have been deposited using an apparatus having features similar to those depicted in FIG. 1 and described above. The target was tantalum and a reactive nitrogen carrier gas was employed to deliver TBTDET directly to a silicon dioxide wafer. An RF powered secondary ionization plasma was employed at a power of 300 watts. The magnetron power applied to the target was 2.18 kilowatts. The substrate was held at a temperature of 310 degrees C. and no bias was applied to it. The overall chamber pressure was approximately 150 mTorr. Molecular hydrogen was delivered via the sputtering inlet at a flow rate of about 2 sccm. Molecular nitrogen carrier gas was bubbled through the TBTDET and entered the chamber through a second inlet next to the wafer at a flow rate of about 8 sccm. The bubbler temperature was maintained at a temperature of 120 degrees C.

In the experiment, a planar film was deposited to a thickness of 1150 nanometers on the silicon dioxide wafer. The deposition rate was 38.3 nanometers/minute. The deposited film included tantalum and nitrogen.

Other Embodiments

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A method of depositing a layer of metal or metal containing compound on a substrate, the method comprising:

(a) physically producing ionized metal atoms from a target and allowing said metal atoms to deposit on the substrate in a process chamber; and (b) adding a precursor containing one or more elements desired in the deposited layer to the process chamber to react chemically or otherwise deposit and produce said metal or metal containing compound on the substrate.

2. The method of claim 1, wherein (a) and (b) overlap temporally.

3. The method of claim 1, wherein (a) and (b) are performed at separate times.

4. The method of claim 1, wherein the ionized metal atoms comprise at least about 5 percent of the total metal atoms derived from the target and contacting the substrate.

5. The method of claim 1, wherein the operation of physically producing ionized metal atoms comprises sputtering metal from the target.

6. The method of claim 1, wherein the operation of physically producing ionized metal atoms comprises evaporating metal from the target.

7. The method of claim 1, wherein the target comprises the metal or a compound of the metal.

8. The method of claim 1, wherein the target comprises a nitride of the metal.

9. The method of claim 1, wherein the operation of physically producing ionized metal atoms comprises exposing metal atoms from the target to a plasma that ionizes at least some of the metal atoms.

10. The method of claim 9, wherein the plasma is generated using at least one of a hollow cathode magnetron target and RF coils.

11. The method of claim 9, wherein the plasma is maintained by applying a power of between about 100 and 1000 Watts to an electrode.

12. The method of claim 1, wherein the process chamber has an internal pressure of between about 1 and 500 mTorr.

13. The method of claim 1, further comprising imparting a negative bias to the substrate.

14. The method of claim 1,
   wherein physically producing ionized metal atoms comprises introducing a sputtering gas through a first inlet in the process chamber, and
   wherein adding the precursor comprises introducing the precursor through a second inlet in the process chamber, proximate the substrate.

15. The method of claim 1, wherein the precursor contributes between about 5 and 95% of the total metal in the layer of metal or metal containing compound.

16. The method of claim 1, wherein adding a precursor comprises delivering a volatile organometallic precursor in a carrier gas to the substrate.

17. The method of claim 1, wherein the layer of metal or metal containing compound comprises a metal selected from the group consisting of copper, titanium, tantalum, cobalt, tungsten, ruthenium, and alloys thereof.

18. The method of claim 1, wherein the layer of metal is a copper seed layer.

19. The method of claim 18, further comprising electrodepositing copper on the copper seed layer.

20. The method of claim 1, further comprising introducing a reactive carrier gas or sputtering gas.

21. The method of claim 1, further comprising varying at least one of (i) the relative rates of deposition by (a) and (b), and (ii) the composition of a carrier gas, a sputtering gas, or the precursor, whereby the layer of metal or metal containing compound varies in composition across the layer thickness.

* * * * *